US010811335B2

(12) United States Patent
Ejeckam et al.

(10) Patent No.: US 10,811,335 B2
(45) Date of Patent: *Oct. 20, 2020

(54) SATELLITE COMMUNICATION TRANSMITTER WITH IMPROVED THERMAL MANAGEMENT

(71) Applicant: Akash Systems, Inc., San Francisco, CA (US)

(72) Inventors: Felix Ejeckam, San Francisco, CA (US); Tyrone D. Mitchell, Jr., San Francisco, CA (US); Paul Saunier, San Francisco, CA (US)

(73) Assignee: Akash Systems, Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/403,894

(22) Filed: May 6, 2019

(65) Prior Publication Data

US 2020/0006189 A1    Jan. 2, 2020

Related U.S. Application Data

(63) Continuation of application No. 15/463,390, filed on Mar. 20, 2017, now Pat. No. 10,332,820.

(51) Int. Cl.
*H01L 23/36* (2006.01)
*H01L 23/373* (2006.01)
(Continued)

(52) U.S. Cl.
CPC ............ *H01L 23/3732* (2013.01); *B64G 1/10* (2013.01); *B64G 1/503* (2013.01);
(Continued)

(58) Field of Classification Search
CPC combination set(s) only.
See application file for complete search history.

(56) References Cited

U.S. PATENT DOCUMENTS 5,428,504 A    6/1995 Bhatla et al.
5,462,772 A    10/1995 Lemelson
(Continued)

OTHER PUBLICATIONS

Ejeckam, et al. "3,000+ Hours continuous operation of GaN-on-Diamond HEMTs at 350° C. channel temperature", 30th Annual Semiconductor Thermal Measurement and Management Symposium (Semi-Therm) in 2014.
(Continued)

*Primary Examiner* — Moin M Rahman
(74) *Attorney, Agent, or Firm* — Wilson Sonsini Goodrich & Rosati

(57) ABSTRACT

A high efficiency satellite transmitter comprises an RF amplifier chip in thermal contact with a radiant cooling element via a heat conducting element. The RF amplifier chip comprises an active layer disposed on a high thermal conductivity substrate having a thermal conductivity greater than about 1000 W/mK, maximizing heat conduction out of the RF amplifier chip and ultimately into outer space when the chip is operating within a satellite under normal transmission conditions. In one embodiment, the active layer comprises materials selected from the group consisting of GaN, InGaN, AlGaN, and InGaAlN alloys. In one embodiment, the high thermal conductivity substrate comprises synthetic diamond.

15 Claims, 5 Drawing Sheets

(51) Int. Cl.
  *H01L 29/20* (2006.01)
  *B64G 1/50* (2006.01)
  *B64G 1/10* (2006.01)
  *H01L 29/778* (2006.01)
  *H04B 1/04* (2006.01)
  *H04B 1/00* (2006.01)

(52) U.S. Cl.
  CPC ........ *H01L 29/2003* (2013.01); *H01L 29/778* (2013.01); *H01L 29/7786* (2013.01); *H04B 1/005* (2013.01); *H04B 1/04* (2013.01)

(56) References Cited

U.S. PATENT DOCUMENTS

| | | |
|---|---|---|
| 5,740,941 A | 4/1998 | Lemelson |
| 6,451,633 B1 | 9/2002 | Yoshida |
| 7,595,507 B2 | 9/2009 | Francis et al. |
| 8,283,672 B2 | 10/2012 | Francis et al. |
| 8,350,295 B1 | 1/2013 | Saunier et al. |
| 8,759,134 B2 | 6/2014 | Babic et al. |
| 8,945,966 B2 | 2/2015 | Francis et al. |
| 9,150,313 B2 | 10/2015 | Puig-Suari et al. |
| 9,738,403 B1 | 8/2017 | Augenstein |
| 9,774,301 B1 | 9/2017 | Maalouf et al. |
| 10,332,820 B2 | 6/2019 | Ejeckam et al. |
| 10,374,553 B2 | 8/2019 | Ejeckam et al. |
| 2003/0183368 A1 | 10/2003 | Paradis et al. |
| 2006/0170004 A1 | 8/2006 | Toyoda et al. |
| 2006/0261471 A1 | 11/2006 | Kikushima |
| 2008/0136514 A1 | 6/2008 | Behzad et al. |
| 2010/0007013 A1* | 1/2010 | Kuroda .................. H01L 24/49 257/712 |
| 2010/0045385 A1 | 2/2010 | Pengelly |
| 2011/0064105 A1 | 3/2011 | Saxler |
| 2012/0105149 A1 | 5/2012 | Saiz et al. |
| 2015/0187924 A1 | 7/2015 | Dasgupta et al. |
| 2015/0222087 A1 | 8/2015 | Williams et al. |
| 2015/0303881 A1 | 10/2015 | Blednov et al. |
| 2016/0091608 A1 | 3/2016 | Robinson et al. |
| 2016/0111774 A1 | 4/2016 | Platzer et al. |
| 2016/0308010 A1 | 10/2016 | Viswanathan et al. |
| 2017/0170094 A1 | 6/2017 | Maples et al. |
| 2018/0123520 A1 | 5/2018 | Szymanowski et al. |
| 2018/0269130 A1 | 9/2018 | Ejeckam et al. |
| 2018/0367100 A1 | 12/2018 | Ejeckam et al. |

OTHER PUBLICATIONS

U.S. Appl. No. 15/624,468 Notice of Allowance dated Mar. 21, 2019.
U.S. Appl. No. 15/463,390 Office Action dated Jan. 11, 2018.
U.S. Appl. No. 15/463,390 Office Action dated Jul. 30, 2018.
U.S. Appl. No. 15/624,468 Notice of Allowance dated Apr. 24, 2019.
U.S. Appl. No. 15/624,468 Notice of Allowance dated May 1, 2019.
U.S. Appl. No. 15/463,390 Notice of Allowance dated Feb. 7, 2019.
U.S. Appl. No. 15/624,468 Office Action dated Oct. 1, 2018.
Co-pending U.S. Appl. No. 16/444,018, filed Jun. 18, 2019.
U.S. Appl. No. 16/444,018 Office Action dated Feb. 21, 2020.
U.S. Appl. No. 16/444,018 Notice of Allowance dated Jun. 10, 2020.

* cited by examiner

SATELLITE COMMUNICATION TRANSMITTER WITH IMPROVED THERMAL MANAGEMENT

CROSS-REFERENCE

This application is a continuation application of Ser. No. 15/463,390, filed Mar. 20, 2017, which is incorporated herein by reference in its entirety.

FIELD OF INVENTION

The invention herein is directed towards systems for communication with other satellites and ground stations. In particular, this application is directed towards thermal management of RF signal amplification sub-systems for satellite communications.

BACKGROUND

There are approximately one thousand operational satellites in orbit today. Five hundred of these satellites are in either a Low-Earth Orbit (LEO) or a geostationary orbit. The usefulness of satellites critically depends on their ability to communicate with their associated Near Earth Networks (NEN). With technological advances in sensing and image capture, the manufacturers of communication links between earth and satellites have been under pressure to provide higher bandwidths at a reduced weight and reduced dissipated power. The weight directly influences the price of a satellite launch, with present day prices ranging in the $10,000 to $100,000/kg, while radiating heat into space requires radiant cooling elements which require space on the spacecraft, ultimately adding to its weight. The satellite thermal design challenge is therefore obtaining more RF power from the transmitter with the same radiant cooling area or reducing the size of the cooling elements while still delivering equal or higher RF power from the transmitter.

There is a growing interest in low earth orbit (LEO) satellites with a small form factor. Due to their smaller size and weight (less than 500 kg), femto-satellites, pico-satellites, micro-satellites and mini-satellites generally cost less to build and deploy into orbit above the Earth than standard, large satellites. CubeSats or U-class spacecraft present opportunities for educational institutions, governments, and commercial entities to launch and deploy satellites for a variety of purposes with fewer costs compared to traditional, large satellites. CubeSats are one type of miniaturized satellite for space research, made up of multiples of 10 cm×10 cm×11.35 cm cubic units with mass not greater than 1.33 kg; these satellites often use commercial off-the-shelf components.

Thermal management in satellites comprises balancing the positive energy flux absorbed from the sun (radiative heating and energy converted by the solar cells) against the negative energy fluxes in the form of heat dissipated by radiation (majority) and in the RF and optical signals emitted by the satellite communication systems (minority).

A simplified block diagram of the main components of a satellite is shown in FIG. 1. A satellite comprises an energy supply block which comprises solar cells and batteries 106, waste heat radiators 107, the control/communications block 101, and the payload 102, which may include sensing, measurement or imaging instrumentation. The control/communications block 101 comprises a transmitter 103, a receiver 104, and a control unit 105 to manage the satellite and the communications to Earth. From a thermal management point of view, not counting the variable energy needed and dissipated in the payload 102, the power $P_{TX}$ dissipated in the transmitter 103 is typically greater than the sum of the powers dissipated in the control unit 105 $P_{CONT}$ and the receiver unit 104 $P_{RX}$. In other words, $P_{TX} > P_{RX} + P_{CONT}$, and this is especially true for satellites with communications in the high frequencies (eg. K-band). The energy consumption (and subsequent required heat dissipation) in the transmitter $P_{TX}$ increases with the data transfer rate according to the Shannon-Hartley theorem. The key thermal-design challenge in satellites is the unbalanced distribution of thermal loads caused by internal and external heat sources. The minimum size of the satellite is determined by the transmitter's dimensions and whether the satellite can produce sufficient power to run the transmitter. This in turn determines the link budget.

Satellite thermal management involves redistributing heat between different subsystems by way of heat conduction (contact) and by radiative emission of thermal energy to space via any surface of the satellite, including specially designed surfaces that have been coated and otherwise prepared for the most efficient radiation of heat into space. Such surfaces are referred to as heat radiators or radiant cooling elements. A heat radiator is a surface on the satellite specifically built for radiating heat into space. These radiators come in several different forms, such as, spacecraft structural panels, flat-plate radiators mounted to the side of the spacecraft, and panels deployed after the spacecraft is on orbit. Whatever the configuration, all radiators reject heat by infrared (IR) radiation from their surfaces. The radiating power depends on the surface's emittance and temperature of the radiant cooling element. The rate of heat radiation increases with the temperature of the radiator. The radiator must reject both the spacecraft waste heat and any radiant-heat loads from the environment. Most radiant cooling elements are therefore given surface finishes with high IR emittance to maximize heat rejection and low solar absorptance to limit heat from the sun. If an existing structural panel is used as a radiant cooling element, there is no additional weight associated with a heat radiator, while heavy deployable radiators can weight as much as 12 kg/m². Geostationary satellites always keep one side turned to the sun, with the other side being used to dissipate heat. In small satellites, all sides are covered with solar cells and little or no surface is left for heat dissipation. This limits the amount of power dissipation possible.

The temperature of space is ~2.7 K, but due to heat absorbed from the sun and electrical energy dissipated by the electronics in a satellite the operating temperatures of the satellite electronics are significantly higher. The temperature of operation of the transmitter subsystem ranges from 240 K to 350 K.

It is clear that there is a need in the industry for communication modules which enable more efficient heat conduction and dissipation into space. This can be most readily achieved by developing a high power RF power amplifiers with improved thermal management which will allow either more RF power for the same radiant cooling element surface or smaller radiant cooling element area being sufficient for equal or smaller radiant cooling elements.

BRIEF DESCRIPTION OF THE INVENTION

Figure 1:
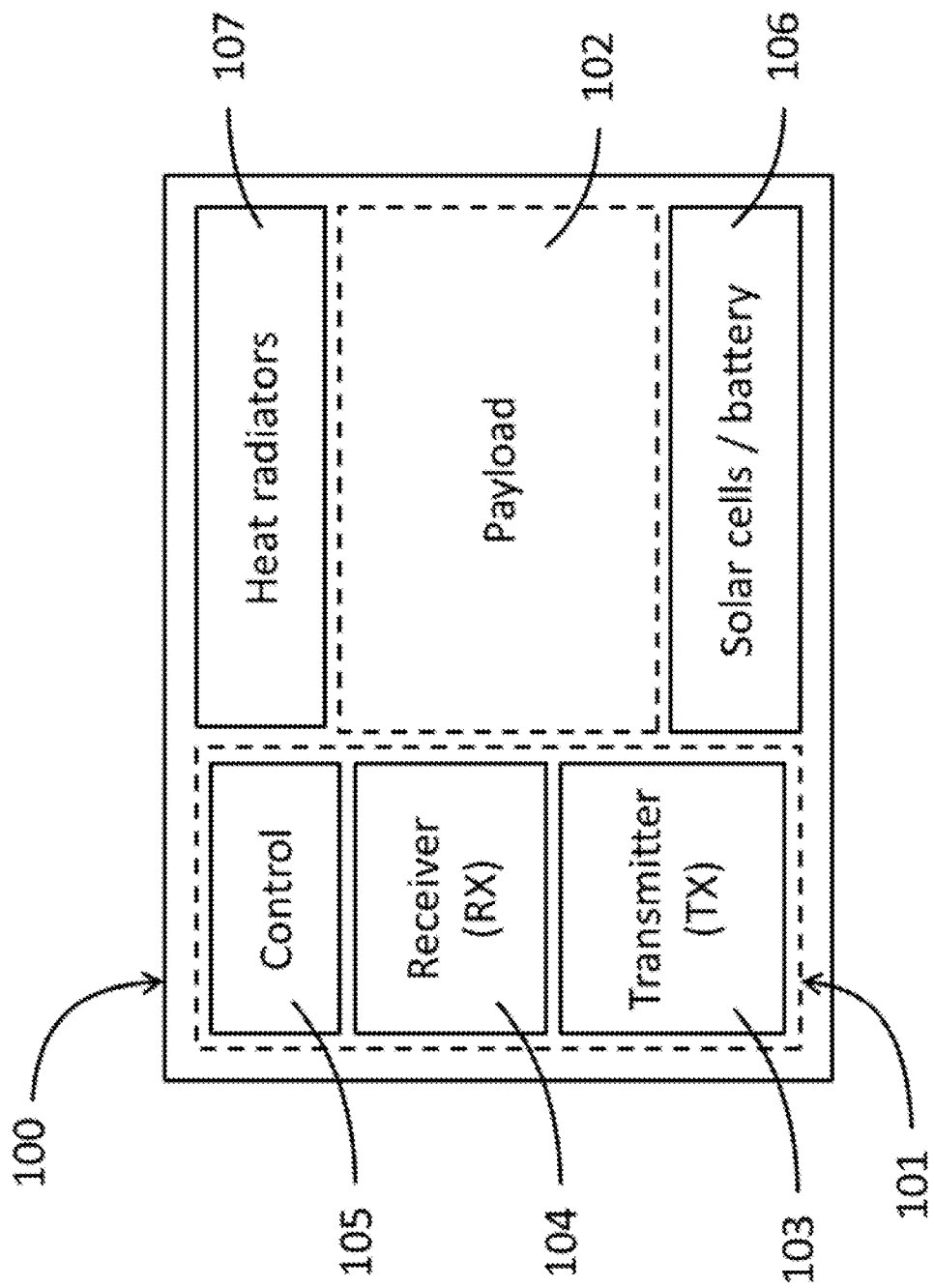
FIG. 1—Block diagram of a satellite according to one embodiment.

One aspect of the present invention is directed to the design and manufacturing of an efficient RF power amplifier for communication with ground stations and other satellites. Satellites communicate or are configured to be able to communicate in a wide range of frequencies and communications bands. This application is targeted towards providing thermal-management technology to enable the application of solid-state amplifiers for satellite communications satellite communications operating in at carrier frequencies from the L-band (1-2 GHz) to millimeter-wave frequencies in the G-band (300 GHz). More specifically, the application is targeted to applications in the 17-20 GHz (Ku/K-bands), 37-42 GHz (Ka/V-bands), and the 81-85 GHz (W-band) frequency ranges. Solid-state power amplifiers in specified bands are not yet available for space applications and generally suffer from low efficiency, in part due to insufficiently low thermal resistance of the chip/package combination.

This application discloses an improvement in the performance of RF amplifier modules for satellite communications by using monolithically integrated microwave circuits based on Gallium-Nitride-on-Diamond (GaND) technology. Microwave amplifiers based on GaND technology comprise active regions (AlGaN/GaN field-effect transistors) and passive components disposed on top of synthetic diamond substrates. Diamond provides thermal conductance surpassed by no other material known to man: depending on the manufacturing conditions, the thermal conductivity ranges between 800 and 2200 W/km. Using diamond in place of sapphire, silicon or SiC as the substrate material in high-power AlGaN/GaN field-effect transistors has been shown to dramatically reduce the device thermal resistance. Diamond greatly assists in spreading the heat below the device and in this way reduces the overall device thermal resistance. The heat spreading is most pronounced in small electronic devices in which the device lateral dimensions are of the order of the substrate thickness or greater. For example, high-electron mobility AlGaN/GaN transistors operating in the K-band are designed with unit gate widths of 100 µm and shorter because of microwave performance. In such devices, the improvement in the thermal performance by using diamond substrates rather than conventional substrates is very significant.

This application discloses a satellite transmitter design with improved thermal design which in turn results in improved transmitter output power and reach. The disclosed solid-state transmitter design would enable satellites to efficiently communicate in the millimeter-wave bands, specifically, in the 17-20 GHz, 37-42 GHz, and the 81-85 GHz frequency ranges.

Although already known to the RF engineering community, GaND technology has not been contemplated as a viable technology for satellite communications primarily because of its perceived technological immaturity and lack of wide commercial availability. Furthermore, it has not been widely appreciated that GaND technology may have an inherent reliability advantage over conventional high-power microwave and millimeter-wave GaN amplifiers (which use GaN on silicon or silicon carbide substrates), reliability being of high importance to space missions. It has been found that GaN devices can degrade significantly slower when one or more buffers layers below the active channel are removed to increase the thermal conductivity and facilitate the attachment of synthetic diamond. This feature is presently available only in GaN on diamond devices.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

A system thermal budget is an assessment of temperature drops on each component between the heat source (for example, the active channels of output-stage power transistor), and the environment around the system (the space surrounding the satellite), where ultimately we wish to dissipate the heat generated by the source. The active layers of a semiconductor device, such as a bipolar transistor or a field-effect transistor, are typically only several micrometers thick, and are built on top of thick mechanical carriers, which are generally referred to as substrates in the industry. For the purposes of this application, a substrate is a carrier on which one or more semiconductor devices are made. A substrate may have functional utility in addition to said mechanical use.

The substrate may be of the same family of materials as the active layers of the electronic device, such as it is when active layers are epitaxially grown on single-crystal substrates. This is the case with GaAs microwave devices on GaAs substrates, AlGaN/GaN devices on sapphire, silicon and SiC substrates.

Electronic devices may be realized by attaching the active layers to substrates made out of materials that have crystalline structure and a material combination that are very different from those of the active layer. Examples are direct-bonded InP lasers on silicon and AlGaN/GaN high-electron mobility transistors attached to synthetic diamond substrates.

Alternatively, synthetic diamond may be grown on top of active layers, thereby forming a substrate on the back of the active layer. What is generally known in the industry as a "chip" is a structure that comprises an electronic device active layer structure disposed on a substrate which is the primary mechanical support for the device. The substrate generally has functions including but not limited to mechanical support. Three substrate attributes used in the industry are (i) electrical conductivity which is needed to connect the active layers to the bottom of the chip, (ii) electrical isolation with low dielectric losses needed in high-frequency devices and surface waveguides where electric fields penetrate into the substrate, and finally (iii) high thermal conductivity with or without associated electrical conductivity.

In this disclosure, a "chip" is defined as comprising an active electronic or optical device disposed on a substrate. It is therefore not possible to obtain a chip having electronic-device active layers without also having an accompanying, attached substrate.

Diamond heat-sinks, diamond heat-spreaders, and other diamond plates intended to spread heat below semiconductor chips for thermal management are well known in the industry; they are sold commercially by companies such as Element Six in Santa Clara, Calif., and Applied Diamond, Inc. from Wilmington, Del. The difference between a diamond substrate and a diamond heat-sink (or heat-spreader or plate) as currently understood in the industry is that a a diamond substrate on which active electronic device layers are attached forms a chip, while the diamond heat-sink is simply a thermal component to which any chip can be attached to help spread the heat generated by the chip. In one embodiment of the present invention, a chip comprising an AlGaN/GaN active device disposed on a synthetic diamond substrate is mechanically attached to a diamond heat-sink thereby creating a structure that has two diamond layers separated by an adhesive layer (generally, a solder).

Thermal Design of AlGaN/GaN Transistors

Figure 2:
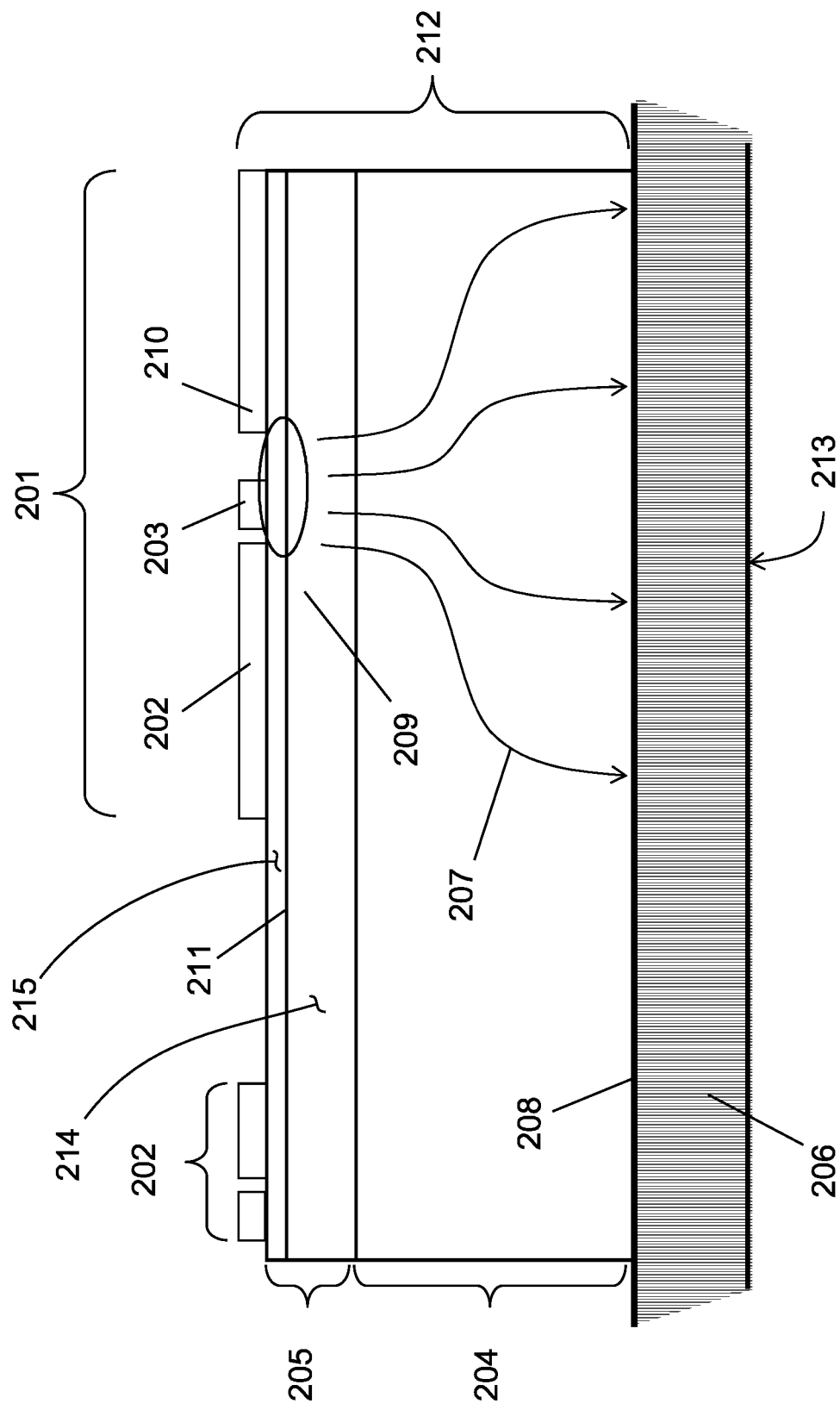
FIG. 2—A cross-section view of an AlGaN/GaN transistor employing Gallium Nitride on diamond (GaND) technology according to one embodiment.

The specific elements of a monolithically integrated microwave or millimeterwave circuit (MIMIC) employing GaND technology are illustrated in FIG. 2. A MMIC chip 212 mounted on a package base 206 illustrated with 200 in FIG. 2 comprises epilayers 205 disposed on a substrate 204, attached to a package base 206 using a solder layer 208. Only the package base 206 is shown in the illustration in FIG. 2 as it is the dominant element affecting the heat flow from the transistor to a heat transfer element to which the package base 206 is attached with surface 213. The heat conducting element is not shown in FIG. 2.

The MIMIC 212 comprises of electrical connections, passive and active circuits 202 and 201 disposed on the top and as a part of the epilayers 205. The electrical contacts 202, 203, and 210, associated with an output transistor 201, are singled out to illustrate the elements of the transistor and the thermal improvement aspects of the GaND technology. A high-electron mobility transistor (HEMT) 201 or heterostructure field-effect transistor (HFET), as they are also known, comprises of a source 202, gate 203, and drain 210 terminals disposed on an epilayer 205 containing a two-dimensional electron gas source (2DEG) 211 embedded within the epilayer 205 disposed on substrate 204. The transistor 201 operates by using the voltage applied between the gate 203 and the source 202 to control the current flowing along the 2DEG 211 between the source 202 and the drain 210. The region of the 2DEG where the gate voltage controls the current is below the gate 203 terminal. The crystalline layers above the 2DEG are generally referred to as the barrier layer 215 and the buffer layer 214. Together they are a part of the epilayer 205.

Active regions of conventional gallium nitride high-electron mobility transistors comprise GaN and AlGaN alloys, but improvements in the performance of the transistors can be accomplished by including InGaN and InGaAlN alloys for the purpose of the improving electron confinement, transconductance, and/or performance over temperature.

During the operation of this transistor, the majority of the heat dissipates in the region 209. The challenge of realizing a highly thermally efficient transistor lies with the ability of the structure to conduct dissipated heat away from the region 209 to the external world via the substrate 204 and the package base 206. The majority of the heat flows from the location of generation 209 through the buffer layer 214 and the substrate 204 to the package base 206 and across the package base into a heat conducting element (not shown in FIG. 2). The heat spreading and direction of flow is indicated with arrows 207. The objective of an efficient transistor-chip thermal design is to reduce the thermal resistance between the source of heat 209 and the back of the package base 213. For the purposes of this illustration, the thermal resistance is defined as the difference between the peak temperature of the heat generating region 209 and the average temperature of the back surface 213 of the package base 206, divided by the power dissipated during normal operation. Other definitions of thermal resistance, which do not include the package base or specify peak temperature of the package base to heat conducting element rather than the average temperature are used also in the industry. The thermal resistance of the transistor shown in FIG. 2 is a sum of the temperature drops in different layers (or structures) that the heat must traverse in its path from the active layer 209 to the heat conducting element below the package (attached to surface 213).

The physical factors that determine the thermal resistance of the structure shown in FIG. 2 are proportional to the thermal conductivities of the materials and the distance the heat has to traverse and inversely proportional to the effective cross-sectional area the heat has to pass through. From the heat generation area 209, the heat first has to traverse the buffer layer which comprises bulk GaN with thermal conductivity $\kappa \sim 130$ W/mK. The barrier layer (above the 2DEG) is built from ternary and quaternary alloys AlGaN, InGaN, and InAlGaN which exhibit lower thermal conductivities than GaN due to alloy scattering, but contribute less to the thermal conductivity than the buffer layer. As the use of GaN material is fixed by the choice of the type of transistor and the total size of the active layer by desired transistor performance and desired output power, the reduction of buffer-layer thermal resistance is primarily accomplished by optimizing the thickness of the buffer layer. In conventional GaN transistors manufactured in a single epitaxial growth on substrates, such as, silicon carbide, silicon, or sapphire, an interfacial layer has to be grown on top of the substrate prior to growing the buffer layer because these substrates exhibit a non-negligible lattice mismatch with GaN. The interfacial layer has to absorb the dislocations created by growth on a lattice mismatched substrate. Even with the interfacial layer, crystal quality is insufficient for the growth of a high quality 2DEG. The quality of the surface of the buffer layer, on top of which the 2DEG is to be grown, is improved by increasing the thickness of the buffer layer since, depending on growth recipe, GaN tends to mend itself during growth finally producing a surface with lower number of dislocations for thicker buffer-layer films. For this reason, buffer-layer thicknesses in conventional GaN transistors range from 500 nm to 2000 nm, substantially adding to the thermal resistance of the structure.

In gallium nitride on diamond transistors, the buffer layer is not grown on the substrate, but bonded to the diamond substrate. Prior to this bonding process step, the original growth substrate and the interfacial layer are removed exposing the back surface of the buffer layer (surface facing the substrate in FIG. 2). One of the methods of bonding the two materials together is by growing the synthetic diamond substrate on the back of the buffer layer coated with a nanometer thin intermediary dielectric layer. While the bottom surface of the buffer layer is exposed it is also thinned down prior to diamond bonding in order to optimize the thermal properties. This process is not straightforward as very thin layers are subject to cracking and instability due to the embedded strain. Nevertheless, thermally optimal buffer layer thicknesses can be achieved thereby creating devices with high thermal conductivity. The thickness of the buffer layer is adjusted depending on the thermal properties of the interface between the synthetic diamond substrate and the buffer layer. Dramatic improvement over conventional transistors can be achieved when the buffer thickness is less than 150 nm.

The next stage in heat flow from the active layer to towards the package base involves heat traversing the substrate. The thermal conductivity of the substrate is critical in reducing the temperature drop across it and allowing for heat spreading over an area larger than the original heat source 209. This heat flow area enlargement, illustrated with arrows 207, dramatically reduces the temperature drop across the package base 206 for given heat flow. Conventional substrates, such as, silicon carbide ($\kappa$~400 W/mK) and silicon ($\kappa$~150 W/mK) exhibit limited thermal conductivities, while synthetic diamond can regularly be made with thermal conductivities in excess of K $\kappa$~1000 W/mK and represents a substantial improvement in thermal conductance of the device. With the progress of nanotechnology, substrates may in part be made from carbon nanotubes or boron nitride nanotubes which are expected to reach thermal conductivities greater than ~1000 W/mK. The mentioned high-thermal-conductivity materials are also known to have uniaxially anisotropic thermal conductivities (to varying degrees). For the purposes of this application, specifying a thermal conductivity refers to the highest value of thermal conductivity along any one of structure directions.

Finally, heat spreading realized in the substrate reduces the apparent thermal resistance of the package base 206 and the solder 208 used to attach the substrate to the package base 206, thereby, further enhancing the effect of using high thermal conductivity substrates.

The substrate 204 thickness is optimized to the size of the smallest dimension of the heat source 209. The shape and dimensions of the heat source vary depending on the desired frequency of operation and the output power. The smallest dimension varies from 25 µm for millimeter-wave transistors and several hundred micrometers for lowest frequency devices in the L-band. The typical thicknesses of the synthetic diamond substrates range from 50 µm to 100 µm. In some applications, increased substrate thicknesses are needed and this is addressed by either manufacturing thicker substrates (several hundred micrometers) or by inserting a diamond heatsink (heat spreader) between the substrate 204 and the package base 206.

The package base 206 was used as a non-limiting example in the discussion on the design issues related to high power transistors in FIG. 2. The package material, its physical shape and integration can vary depending on the actual environment in which the RF power amplifier is to be used. For example, the package base may be realized as an integral part of the heat conducting element, it may comprise synthetic diamond or beryllium oxide for improving heat conducting and it may include heat pipes for assisting cooling as disclosed below in further text, without departing from the spirit of the invention.

In one embodiment, the active layers comprise AlGaN alloys on top of a GaN buffer layer attached to a synthetic diamond substrate. In another embodiment, the active layers comprise materials selected from a group consisting of GaN, AlGaN, InGaN and InGaAlN alloys. In yet another embodiment, the substrate comprises a material with thermal conductivity greater than ~1000 W/mK. In another embodiment, the thickness of the buffer layer, namely the distance between the 2DEG 2011 and the top surface of the substrate 204 is less than 150 nm. In yet another embodiment, the synthetic diamond substrate may comprise more than one layer of synthetic diamond attached to each other by solder or atomic attachment resulting from growing extra layers on top of already existing diamond layers.

Thermal Management in Satellites

The thermal management challenge in satellites stems from the fact that heat dissipation from the satellite is performed by radiation of electromagnetic waves into space, namely, black-body radiation. This is different from cooling on the surface of the Earth where the heat dissipation into the environment is predominantly carried out by air or liquid convection.

Heat dissipation from a black-body into space depends on the temperature of the radiating surface according to Stefan-Boltzmann law: $P=\sigma T^4$, where $P[W/m^2]$ is the power density emitted by a surface, $\sigma=56.7$ nW/m$^2$/K$^4$, Stefan-Boltzmann constant, and T[K] is absolute temperature. A small fraction of the electrical power acquired from the solar cells is emitted towards Earth in the form of RF signals, while the major fraction is converted to heat by the electronics in the control unit, the receiver, the transmitter, and the payload, and must be dissipated into space via cooling radiators. This latter fraction critically depends on the amplifier efficiency.

The primary challenge of the thermal budget design is to ensure that the actual maximum temperature $T_{DEV}$ of the active element of the electronic device never exceeds the manufacturer's specification for the maximum allowed, or nominal temperature $T_{DEV}(max)$. The performance of the device and expected lifetime, critical in space missions, is qualified for temperatures not exceeding the nominal maximum temperature $T_{DEV}(max)$. The typical values of $T_{DEV}(max)$ range from 150° C. to 225° C., depending on the manufacturer and type of material. The greatest advantage of using a GaND monolithic microwave integrated circuit (MMIC) is provided due to the nonlinearity of the radiative dissipation into space with temperature (fourth power of temperature). This is explained with the help of FIGS. 3 and 4.

Heat transfer or distribution from the heat source (for example, area 209 in the exemplary MIMIC illustrated in FIG. 2, the MMIC being a part of an RF power amplifier) to the radiant cooling element is realized by heat conduction which is defined in this disclosure to include the possibility of heat transfer using heat pipes. Heat conduction refers to a heat conducting system in which the heat source is placed in thermal contact with a structure with high thermal conductivity, where the other end of the structure is placed in thermal contact with the radiant cooling element. Heat pipe cooling systems comprise a recirculating closed fluid system in which a liquid is brought to the location where heat is generated (RF power amplifier) and the liquid evaporated consuming latent heat of the liquid. The gas phase is guided through pipes to a radiant cooling element where the gas is condensed to the liquid phase releasing the heat. This type of heat pipe system is common in cooling systems on the ground and in satellites and is available commercially from a variety of suppliers, for example, Advanced Cooling Technologies, Inc., based in Lancaster, Pa. For the purposes of this application, heat pipe cooling systems and heat conducting structures comprise a part of the heat conducting element, where the heat is taken from the heat source, such as, a RF power amplifier to the location where the heat is dissipated into space, namely, the radiant cooling element.

Figure 3:
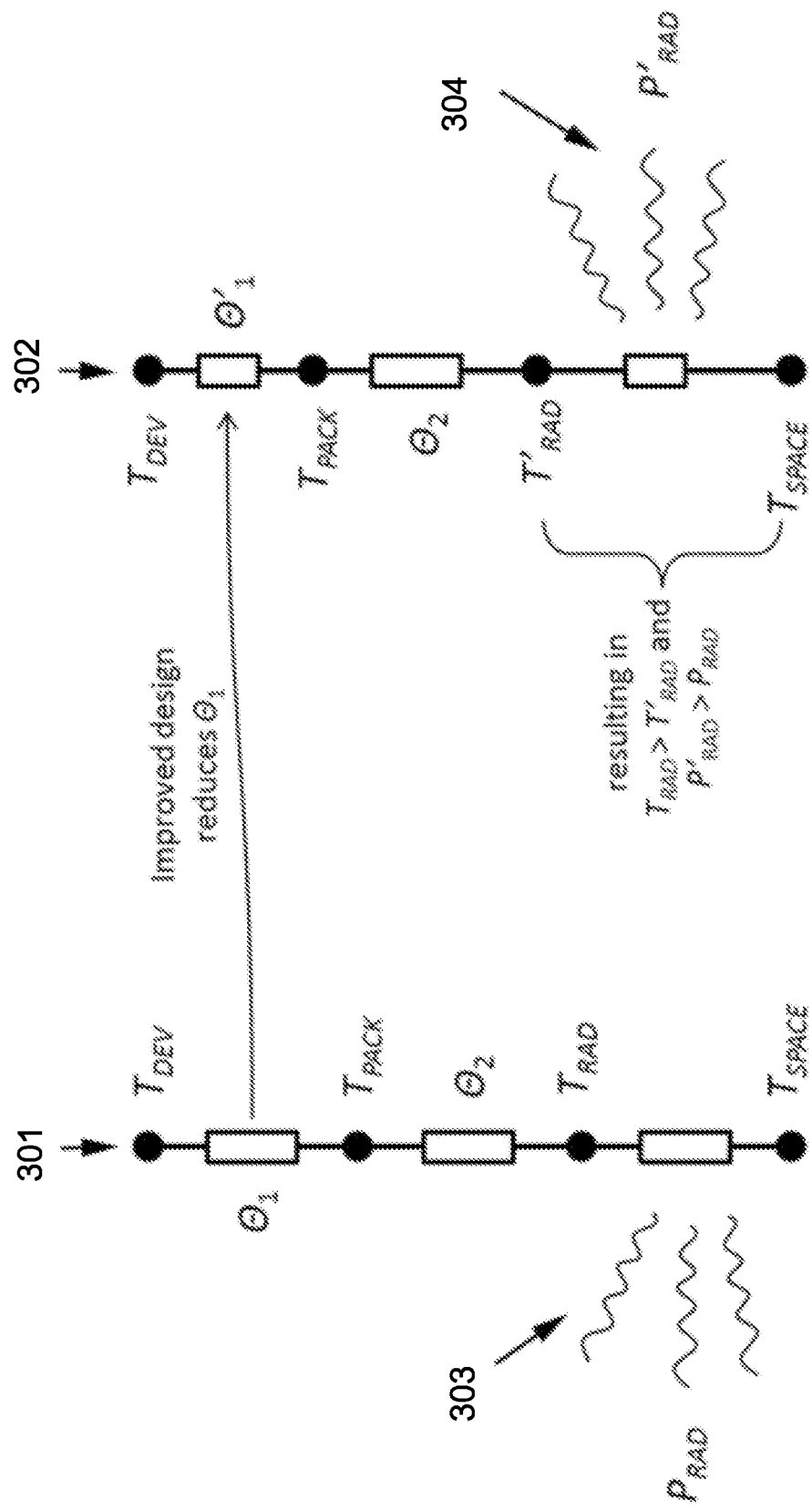
FIG. 3—Distribution of heat in a RF power amplifier system

FIG. 3 illustrates two simplified satellite thermal budgets 301 and 302 for the fraction of the power dissipated as heat in the transmitter. The resistors indicate thermal resistance associated with each part of the heat path, while the nodes between the resistors represent temperatures. The prior art thermal budget is denoted with 301 and it shows the heat generated by the device (energy not transmitted out in the form of an RF signal) raising the electronic device active region temperature ($T_{DEV}$) [in Kelvin] relative to the temperature of the outer surface of the amplifier package ($T_{PACK}$) in proportion to the product of the power dissipated P [in Watts] and the thermal resistance $\Theta_1$ [K/W] between the device and the package surface. This thermal resistance is determined by the materials involved in manufacturing the chip, by the type of chip attachment, and by the type of package, as discussed above in connection with FIG. 2. Using chips with diamond substrates dramatically reduces $\Theta_1$. The temperature of the back of the amplifier package ($T_{PACK}$) is raised above the temperature of the heat radiator ($T_{RAD}$) in proportion to the product of the power dissipated P and the thermal resistance $\Theta_2$ of a heat conducting element, which in turn depends on the physical dimensions and the material used to construct the heat conducting element. The heat conducting element is any structure that thermal connects the RF amplifier to the heat radiators; it may contain fluid cooling pipes as is well known in the art. The temperature of the radiant heat element $T_{RAD}$ determines the rate at which the heat can be radiated into space, which is at temperature $T_{SPACE}$~2.7 K. The radiant heat element temperature $T_{RAD}$ will adjust itself to the power dissipated power P. For example, if the amplifier was off for some time and then suddenly turned on, the heat generated by the active region of the amplifier will flow through the chip and the heat conducting structure to the radiator warming up all structures on its path (slowed down due to their heat capacity) and gradually raising the temperature of the radiator until it reaches a steady state in which all of the heat power P generated by the amplifier is emitted into space. The resulting steady-state device temperature $T_{DEV}$ (shown in FIG. 3) can be obtained from the temperature balance equation:

$$T_{DEV} = P(\Theta_1 + \Theta_2) + T_{RAD} \quad (1)$$

where $$P = A\sigma(T_{RAD}^4 + T_{SPACE}^4) \quad (2)$$

If one requires that $T_{DEV}$ never exceeds $T_{DEV}$(max), one can determine (numerically) the associated maximum power $P_{MAX}$ (and $T_{RAD}$) for which the amplifier still works within specifications. The radiating area of the heat radiator is denoted with A [m²]. FIG. 3 resistor networks 201 illustrates this case with thermal resistances between different temperatures shown as boxes (analogous to electrical resistors). The last "resistor" shows that the difference between $T_{RAD}$ and $T_{SPACE}$ drives the net emission into space. On the surface of the earth the power dissipated into the environment via conduction and convection is approximately proportional to the temperature $T_{RAD}$, while in space the power dissipated into the environment proportional to the fourth power of temperature. The significance of this non-linearity can be best demonstrated if we look at the relative sensitivity of power dissipation capability to the change in the amplifier thermal resistance: $d \ln P/D\theta_1$ computed from (1) and (2) for the cases when dissipation is assumed to be directly proportional to T (for earth) and proportional to the fourth power i.e. $T^4$ (for space). In space, the change in power dissipation ability of the amplifier with the chip-to-package thermal resistance el for a fixed maximum active region temperature is given by:

$$\frac{1}{P} \cdot \frac{\delta P}{\delta \Theta_1} = -\frac{1}{\Theta_1 + \Theta_2 + \frac{1}{4 \cdot (A\sigma P^3)^{\frac{1}{4}}}} \approx 4 \cdot (A\sigma P^3)^{\frac{1}{4}} \quad (3)$$

We compare this to the case where the satellite is at the surface of the Earth and where the temperature distribution is the same, but the cooling is dominated by conduction and convection (rather than radiation). We find that the effect of changing the chip thermal resistance on the amplifier power dissipation ability is lower:

$$\frac{1}{P} \cdot \frac{\delta P}{\delta \Theta_1} = -\frac{1}{\Theta_1 + \Theta_2 + \frac{1}{(A\sigma P^3)^{\frac{1}{4}}}} \approx (A\sigma P^3)^{\frac{1}{4}} \quad (4)$$

The benefit of changing the thermal resistance el is most clearly seen if we consider equations (3) and (4) in the limit where the heat-flow bottleneck is the radiant heat element, namely, $\Theta_1$ and $\Theta_2$ are negligible relative to the third term in the denominator of (4). In this case, the power handling capability of the power amplifier is four (4) times more sensitive to the changes in the amplifier thermal resistance $\Theta_1$ than it would be on the surface of the Earth. Stated differently, keeping everything else constant, a reduction of thermal resistance of the power amplifier would be four times more effective in space than on the surface of the Earth. This improvement is illustrated in FIG. 2 with the resistor network 201 where $\Theta_1$ has been reduced to a new value $\Theta_1'$ which then in turn dramatically increases the radiation efficiency and enhances the emission for heat into space 204. Applying this understanding, which was not appreciated or obvious prior to the present invention, to the problem of thermal management for electronic devices on satellites has led to the present proposal of using synthetic diamond substrates for devices intended for use on satellites.

It has been confirmed using heat flow computations that for a given power, the greatest temperature drop in a transistor occurs in the immediate proximity of the heat source (area 209 in FIG. 2) because in that area the heat flow is most constrained geometrically. Bringing synthetic diamond to the immediate proximity of the active layers dramatically improves heat spreading and lowering of the thermal resistance of the devices and thermal management in spacecraft.

Figure 4:
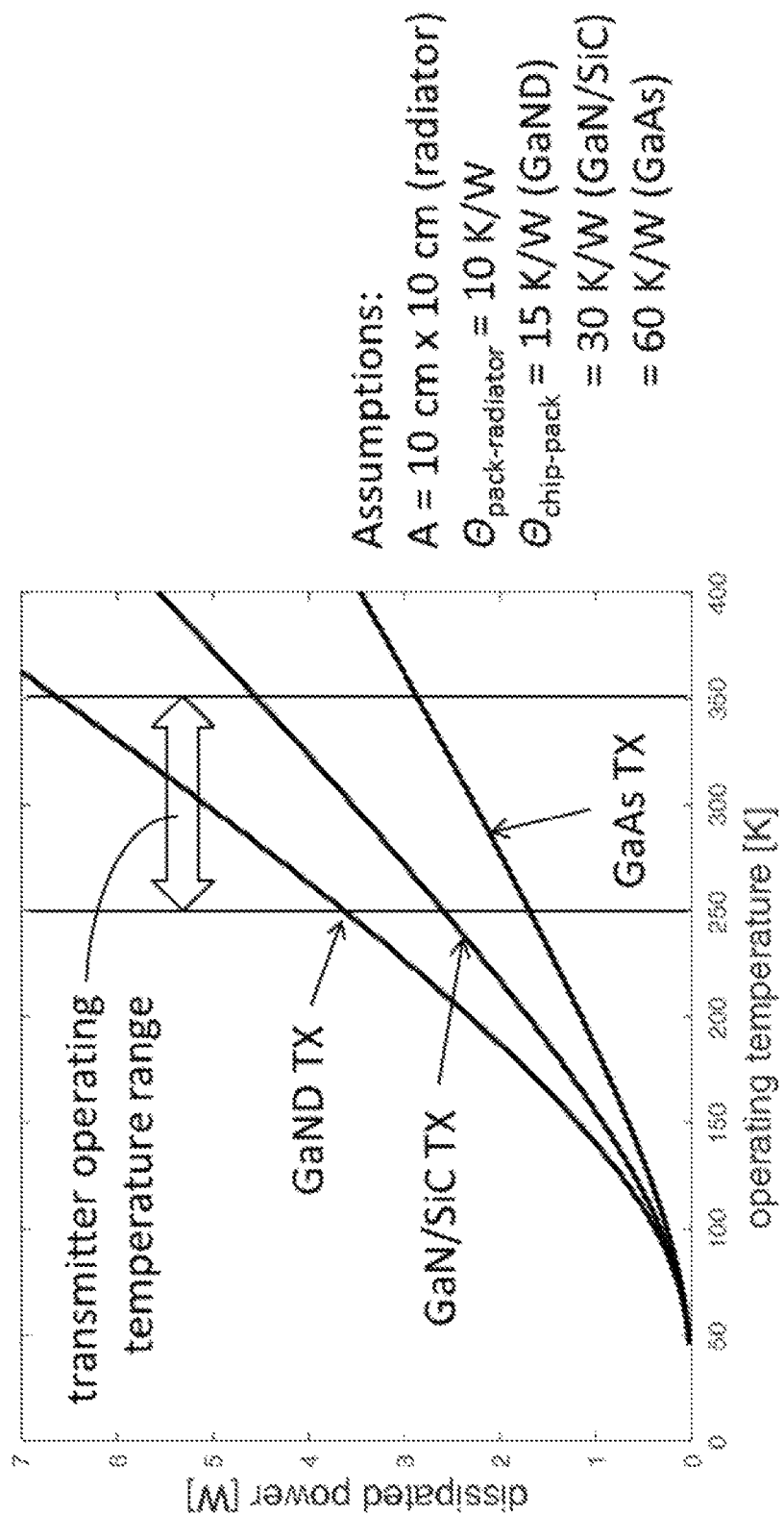
FIG. 4—Computed improvement in power handling of RF amplifiers using the disclosed technology as compared to conventional amplifiers (GaAs and GaN/SiC).

FIG. 4 illustrates an example computation of the power P that can be dissipated for some assumed thermal resistance values for the power amplifier and the heat conducting element. For a conventional 5 W GaAs power amplifier, we set $\Theta_1$=60 K/W and the heat conducting element thermal resistance $\Theta_2$=10 K/W. By replacing the GaAs amplifier with a GaND, we can reduce the amplifier thermal resistance by a factor of 4 and if we use a typical area of one side of a small satellite A=0.01 m², we obtain the graph in FIG. 4, which illustrates that the power dissipation capability of the GaND amplifier increases by a factor of greater than 2 for the same operating temperature range.

In one embodiment of present invention, a satellite comprises an RF power amplifier for communication with Earth or other satellites that uses a microwave monolithically integrated circuit (MIMIC) in which the active layers are disposed on a synthetic substrate (referred to as GaND MIMIC), and said MMIC is thermally coupled to a radiant cooling element. In another embodiment, said MIMIC is disposed on top of a diamond heat-sink, which in turn is thermally coupled to a radiant cooling element optionally via a heat conducting element.

Figure 5:
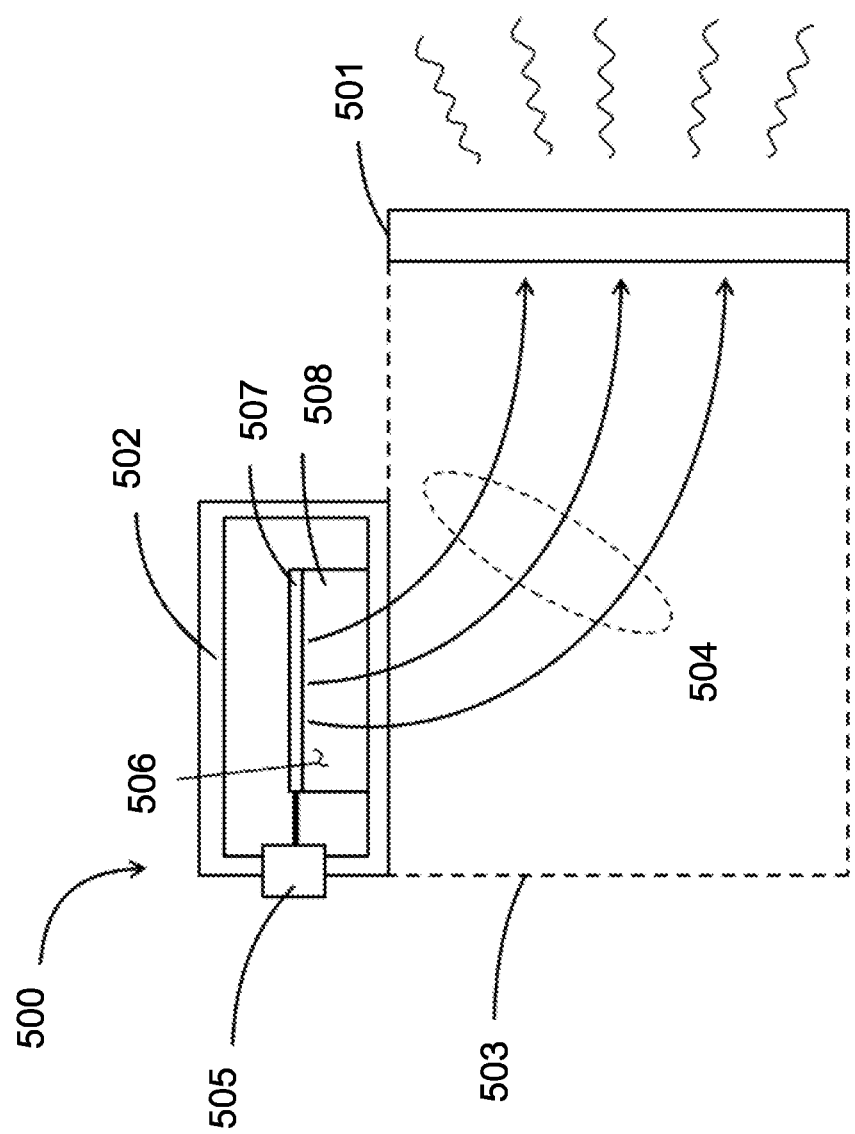
FIG. 5—Block diagram of a transmitter subsystem according to one embodiment, in which a Gallium Nitride on diamond (GaND) amplifier is placed in thermal contact with the cooling radiator.

One embodiment of a satellite transmitter is disclosed with the help of FIG. 5 which shows a non-limiting example. A satellite transmitter sub-system 500 comprises an RF power amplifier module 502 (amplifier chip in a package) thermally coupled to radiant cooling element 501 via heat conducting element 503. Amplifier module 502 comprises an amplifier chip 506 that comprises an active layer 507 involving AlGaN and GaN epilayers, and a synthetic diamond substrate 508. The RF signals enter and are emitted from the amplifier via RF connectors 505 (only one shown). Substrate 508 is in thermal contact with heat conduction element 503. The heat generated by RF power amplifier active layer 507 is conducted from active layer 507, through synthetic diamond substrate 508 and then through heat conducting element 503 to radiant cooling element 501 as shown with arrows 504. Radiant cooling element 501 emits energy into space.

In some embodiments, an efficient satellite transmitter is used in a satellite with a communications frequency band in one of 17-20 GHz, 37-42 GHz, or 81-85 GHz, as in these particular applications, the size of the satellite and orbit will require a particularly high link budget, and the improved thermal performance will be crucial in enabling practical communication subsystems. Employing diamond substrates with field-effect transistors improves heat spreading and thereby lowers the thermal resistance of the device, the improvement being most pronounced in devices with feature sizes that are comparable to the thickness of the substrate. This is particularly relevant to devices operating at Ku band frequencies and above, as the unit gate width becomes smaller than the typical substrate thickness of 100 µm.

Unlike geostationary satellites, many of the small satellites in LEO get sun irradiation from all sides and hence maximize the solar energy harvesting. The smaller the satellite, the more important efficient thermal performance, amplifier efficiency and lack of radiant cooling elements become, and high amplifier efficiency and low weight become enabling. In one embodiment, an efficient satellite transmitter is used in a small satellite (femto-, nano-, or micro-satellite) without a specifically built radiant cooling element. In other words, the entire surface of the satellite effectively serves as a radiant cooling element.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A device, comprising a radiofrequency (RF) amplifier chip in thermal communication with a radiant cooling element, wherein the RF amplifier chip comprises an active layer disposed adjacent to a thermally conductive substrate separate from the radiant cooling element, wherein the thermally conductive substrate has a thermal conductivity greater than about 1000 W/mK, wherein:
   (i) the RF amplifier chip is configured to conduct heat to the thermally conductive substrate,
   (ii) the thermally conductive substrate is configured to conduct heat to the radiant cooling element, and
   (iii) the radiant cooling element is configured to radiate heat out of the radiant cooling element.

2. The device of claim 1, wherein the active layer comprises a two-dimensional electron gas layer positioned no further than 150 nanometers from the thermally conductive substrate.

3. The device of claim 1, wherein the active layer comprises a Group III-V material.

4. The device of claim 3, wherein the active layer comprises at least one material selected from the group consisting of GaN, InGaN, AlGaN, and InGaAlN.

5. The device of claim 1, wherein the RF amplifier chip is configured to operate at a wavelength in a range from 1 gigahertz (GHz) to 300 GHz.

6. The device of claim 1, wherein the thermally conductive substrate comprises diamond.

7. The device of claim 1, wherein the thermally conductive substrate comprises carbon.

8. The device of claim 1, wherein the RF amplifier chip is in thermal communication with the radiant cooling element via a heat conducting element.

9. A device, comprising a radiofrequency (RF) amplifier chip configured for thermal communication with a radiant element, wherein the RF amplifier chip comprises a first substrate comprising a first material disposed adjacent to a second substrate comprising a second material that is different than the first material, which second substrate is separate from the radiant element, wherein the second substrate has a thermal conductivity greater than about 1000 W/mK, and wherein (i) the first substrate is configured to conduct heat to the second substrate, and (ii) the second substrate is configured to conduct heat to the radiant element.

10. The device of claim 9, wherein the active layer comprises a two-dimensional electron gas layer positioned no further than 150 nanometers from the thermally conductive substrate.

11. The device of claim 9, wherein the active layer comprises a Group III-V material.

12. The device of claim 11, wherein the active layer comprises at least one material selected from the group consisting of GaN, InGaN, AlGaN, and InGaAlN.

13. The device of claim 9, wherein the RF amplifier chip is configured to operate at a wavelength in a range from 1 gigahertz (GHz) to 300 GHz.

14. The device of claim 9, wherein the thermally conductive substrate comprises diamond.

15. The device of claim 9, wherein the thermally conductive substrate comprises carbon.

* * * * *